United States Patent [19]
Ernst et al.

[11] Patent Number: 4,510,449
[45] Date of Patent: Apr. 9, 1985

[54] METHOD FOR RECORDING TWO-DIMENSIONAL NUCLEAR MAGNETIC RESONANCE SPECTRA AND A DEVICE FOR CARRYING OUT THE SAME

[75] Inventors: Richard R. Ernst, Winterthur; Kurt Wüthrich, Wallisellen, both of Switzerland; Slobodan Macura, Belgrade, Yugoslavia

[73] Assignee: Spectrospin AG, Switzerland

[21] Appl. No.: 438,181

[22] Filed: Nov. 1, 1982

[30] Foreign Application Priority Data

Nov. 4, 1981 [DE] Fed. Rep. of Germany ....... 3143625

[51] Int. Cl.$^3$ ............................................. G01R 33/08
[52] U.S. Cl. ..................................... 324/309; 324/311
[58] Field of Search ............... 324/300, 307, 311, 309, 324/312, 313, 314

[56] References Cited
U.S. PATENT DOCUMENTS

4,318,043 3/1982 Crooks ............................... 324/309

OTHER PUBLICATIONS

S. Macura et al., Two-Dimensional Chemical Exchange and Cross-Relaxation Spectroscopy of Coupled Nuclear Spins, Journal of Magnetic Resonance, vol. 43, 1981, No. 2, pp. 259–281.
K. Nagayma, Spin Decoupling in Two-Dimensional J-Resolved NMR, J. Chem. Phys., vol. 71, 1979, No. 11, pp. 4404–4415.
R. Baumann, Improvement of 2D NOE and 2D Correlated Spectra by Triangular Multiplication, J. of Mag. Res., vol. 44, 1981, pp. 76–83, 402–406.
W. E. Hull, The New Aspect 2000 High-Speed Pulse–Programmer, Bruker-Report, 1980, No. 2, pp. 10–13.

Primary Examiner—Michael J. Tokar
Attorney, Agent, or Firm—McCormick, Paulding & Huber

[57] ABSTRACT

In recording two-dimensional nuclear magnetic resonance spectra, J cross peaks which hinder the interpretation of the spectragram and mask cross peaks of incoherent exchange processes or transfers are eliminated by one of two methods. In the first method, for each repetition of a measurement with an evolution period $t_1$ between the first and second of two successive 90 degree pulses, the interval between the second and third 90 degree pulse (mixing time $t_m$) is varied systematically in proportion to the evolution period. The two-dimensional spectra obtained is subjected to triangular multiplication or symmetrization so that all peaks which do not possess counterparts at the mirror symmetry positions of the main diagonal are eliminated. In the second method, the mixing time is kept constant and a 180 degree pulse is inserted between the second and third 90 degree pulse with a varying interval $t_p$ between the 180 degree pulse and the second 90 degree pulse for each repetition of a measurement. A spectrometer for carrying out this method permits critical parameters to be adjusted.

3 Claims, 11 Drawing Figures

METHOD FOR RECORDING TWO-DIMENSIONAL NUCLEAR MAGNETIC RESONANCE SPECTRA AND A DEVICE FOR CARRYING OUT THE SAME

The present invention relates to a method for recording two-dimensional nuclear magnetic resonance spectra in which the nuclear spin system to be investigated is excited by three successive 90° pulses applied at intervals and the interferogram obtained after application of the third 90° pulse is subjected to Fourier analysis, in which further a plurality of such measurements is taken with different intervals (evolution period $t_1$) between the first and the second 90° pulses and the resulting different amplitude parameters of the resonance lines obtained by the said Fourier analysis are stored as instantaneous values of an additional interferogram and subjected to a second Fourier analysis, and in which simultaneously with each repetition of the measurement with a varied evolution period $t_1$ the time interval between the second and the third 90° pulse (mixing time $t_m$) is systematically varied by small increments covering the domain defined by the period of the frequency shifts caused by scalar or coherent couplings.

Two-dimensional nuclear magnetic resonance spectroscopy has been described in a paper by J. Jeener, B. H. Meier, P. Bachmann and R. R. Ernst in J. Chem.-Phys. J 1, 4546 (1979). This technique makes it possible to observe exchange processes in a molecule which result in variations of the resonance frequency of a nuclear spin. The Fourier analysis of the first interferogram provides information with respect to the resonance frequency after the exchange, while the Fourier analysis of the interferogram obtained by varying the evolution period provides information with respect to the original resonance frequency of the same excited spin moment. In this manner, complete networks of incoherent magnitization transfer via chemical exchange and dipole-dipole cross-relaxation can be obtained. A particularly promising application is to be seen in the use for the determination of the molecular conformations of biological macromolecules. For the determination of the rate parameters which govern the magnitization exchange process it is necessary to perform experiments for different intervals between the second and the third 90° pulse (mixing time $t_m$), including very short values of the mixing time $t_m$. Under these conditions, so-called J-cross-peaks may occur in the two-dimensional spectrum, caused by coherent magnitization transfer (S. Macura, Y. Huang, D. Suter and R. R. Ernst, J. Magn. Resonance 43, 259 (1981)). An exact analysis of the spectrum requires the elimination of the J-cross-peaks originating from a coherent exchange. The known method for eliminating the J-cross-peaks consists in taking the statistical average obtained from random variations of the mixing time $t_m$. This may, however, lead to a loss of information by smearing of the J-cross-peak intensities in the direction of the frequency axis and by the generation of low-level waves or ridges which may mask low intensity exchange peaks.

Now, it is the object of the present invention to provide a method which permits the elimination of the J-cross-peaks without any loss of information.

According to the invention, this problem can be solved in that starting from an initial value $t_{m0}$, the mixing time $t_m$ is varied proportionally to the evolution period $t_1$ ($t_m = t_{m0} + \chi t_1$) so that with the envisaged number of n measurements the time variation of the mixing time $t_{mn} - t_{m0}$, which is relatively small compared to $t_{m0}$, is substantially equal to the period of frequency displacements caused by scalar or coherent coupling, and in that the two-dimensional spectrum thus obtained is subjected to the techniques of triangular multiplication or symmetrization whereby all peaks which do not possess counterparts at the mirror symmetry position with respect to the main diagonal are eliminated.

In the method of the application, the variation of the mixing time $t_m$ is sufficiently small to ensure that although the amplitude is a function of the mixing time, the amplitude of the individual lines the variations of which provide information on the development with time of the incoherent exchange processes, remains practically unchanged. In contrast, the periodical, relatively rapid exchange processes caused by coherent or scalar coupling are unilaterally displaced relative to the diagonal so that they do no longer appear in the spectrum after symmetrization.

A similar effect is obtained when a 180° pulse is inserted between the second and the third 90° pulse and when—also in accordance with the invention—simultaneously with each repetition of the measurement with a varied evolution period $t_1$ the interval $t_p$ between the 180° pulse and the second 90° pulse is systematically varied, starting from an initial value $t_{p0}$ and in direct proportion to the evolution period $t_1$ ($t_p = t_{p0} + 102\, t_1$) so that with the envisaged number of n measurements the time variation of the positioning time $t_{pn} - t_{p0}$, which is relatively small compared to $t_m$, is in the range of the period of frequency displacements caused by scalar or coherent coupling, and the two-dimensional spectrum thus obtained is subjected to the techniques of triangular multiplication or symmetrization whereby all peaks which do not possess counterparts at the mirror symmetry position with respect to the main diagonal are eliminated.

It appears that it is a common feature of both forms of the method of the invention that double lines caused by scalar or coherent coupling are eliminated from the two-dimensional nuclear magnetic resonance spectrum so that incoherent exchange processes and in particular in Overhauser effect (NOE) can be observed undisturbed. The required triangular multiplication or symmetrization techniques have been described by R. Baumann, Anil Kumar, R. R. Ernst and K. Wüthrich in J. Magn. Resonance 44, 76 (1981) and R. Baumann, G. Wider, R. R. Ernst and K. Wüthrich in J. Magn. Resonance 44, 402 (1981).

The method of the invention can be carried out with all types of nuclear magnetic resonance spectrometers having a generator for generating three or four successive rf pulses at selective intervals. But the present invention has also for its object to provide a nuclear magnetic resonance spectrometer of this type which is particularly suited for carrying out the method of the invention and which is characterized in that it comprises means for pre-setting an interval $t_m$ or $t_p$ between the second and the third pulse which varies in direct proportion to the interval $t_1$ between the first and the second pulse, by corresponding selection of a first interval $t_1$, an initial value $t_{m0}$ or $t_{p0}$ for the interval between the second and the third pulse and a proportionality factor $\chi$, so that $t_m = t_{m0} + \chi t_1$ or $t_p = t_{p0} + \chi t_1$.

Further details and advantages of the invention will be described hereafter with reference to the drawings in which FIG. 1 shows the time diagram of the signal sequence employed in the first variant of the method of the invention;

Figure 1:
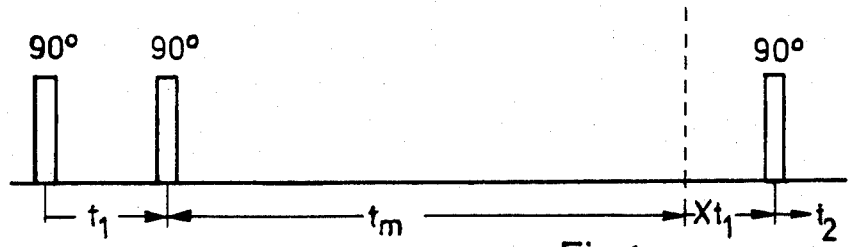
Figure 2:
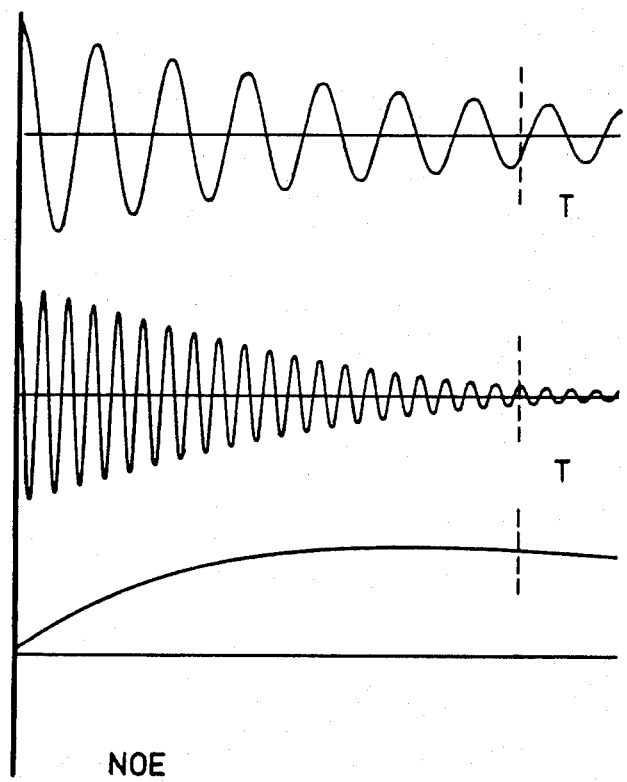
FIG. 2 shows the time diagram of the signals obtained by the excitation of a spin system, for a system with zero and double quantum coherence.

The basic processes of two-dimensional exchange spectroscopy are shown in FIGS. 1 and 2. As appears from FIG. 1, a first 90° pulse is applied to create transverse magnitization. The evolution time period $t_1$ serves to "frequency label" the various magnetization components by their respective Larmor precession frequencies. As is generally known, the evolution period $t_1$ is systematically increased in two-dimensional spectroscopy from experiment to experiment until conclusion of the complete two-dimensional experiment.

At the end of the evolution period $t_1$, a second 90° pulse rotates the x-magnetization component along the z-axis, whereupon the slow exchange processes to be investigated may take place during the following mixing period $t_m$. A third 90° pulse generates again transverse magnetization. The result of the exchange process is then identified by the precessing frequencies of the magnetization components during the detection period $t_2$. A two-dimensional Fourier transformation of the acquired signal $s(t_1, t_2)$ leads, finally, to the desired two-dimensional exchange or NOE spectrum. The intensities $a_{AB}$ and $a_{BA}$ of the exchange cross-peaks for a system with two exchanging nuclei grow with the magnetization exchange rate $R_C$ towards equilibrium when increasing the mixing time, while simultaneously the leakage rate $R_L$ attenuates the cross-peak intensities. According to S. Macura and R. R. Ernst in Mol. Phys. 41, 95 (1980), these processes can be described by the formula $$a_{AB}(t_m) = a_{BA}(t_m) = M_0/4[1 - \exp(-R_C t_m)] \exp(-R_L t_m). \quad (1)$$

In the description given so far, the transverse magnetization components which remain after the second 90° pulse have been neglected. In addition, it is well-known that in coupled spin systems a pair of 90° pulses, separated by an interval $t_1$, generates also zero, double and multiple quantum coherence (Aue et al in J. Chem. Phys. 64, 2229 (1976)). These coherence components develop during the mixing time $t_m$, as schematically shown in FIG. 2. The third 90° pulse partially transforms these components into observable transverse magnetization. These additional pathways of coherence transfer are responsible for the occurrence of the so-called J-cross-peaks in a two-dimensional exchange spectrum. Therefore cross-peaks may contain, at the same time, contributions from incoherent magnetization transfer via a random exchange process as well as contributions from coherent transfer through a J-coupling network.

For ease of interpretation, it is desirable to suppress the J-cross-peaks in a two-dimensional exchange spectrum. The basic feature on which the suppression technique proposed by the invention relies is the characteristic dependence of coherent and incoherent transfer processes on the duration of the mixing period. While the incoherent transfer is, according to Eq. (1), a slowly varying process, the coherent transfer shows an oscillatory dependence on the mixing time.

According to the invention, the mixing time $t_m$ is varied in parallel with the evolution time $t_1$, according to the following formula:

$$t_m = t_{m0} + \chi t_1. \quad (2)$$

The maximum increment of the mixing time is selected sufficiently small to avoid a notable perturbation of the incoherent exchange process. The method of the invention leads to a displacement of all J-cross-peaks from their original positions along the $\omega_1$ direction. This displacement destroys the inherent symmetry of the J-cross-peak pattern. The cross-peaks offset along the $\omega_1$ direction do not possess counterparts at the mirror symmetry position with respect to the main diagonal of the two-dimensional spectrum. They can hence be eliminated by the techniques of triangular multiplication or symmetrization, which retains only peaks occurring in symmetric pairs.

To describe the method of the invention in greater detail, we are now going to consider a magnetization component originally belonging to transition a and precessing with the frequency $\omega_a$ before exchange. The mixing process is assumed to transform this magnetization component into coherence of another transition b with frequency $\omega_b$. The pathways during mixing may lead through all possible transitions k with precession frequencies $\omega_k$, including zero quantum, single quantum and multiple quantum coherence (FIG. 2). These processes lead then to the observable magnetization component $$M_{ab}(t_1, t_m, t_2) = \quad (3)$$

$$M_{0a} \exp\{-i\omega_a t_1 - t_1/T_{2a}\} \left[ \sum_k R_{bk} R_{ka} \exp\{-i\omega_k t_m - t_m/T_{2k}\} \right] \cdot$$

$$\exp\{-i\omega_b t_2 - t_2/T_{2b}\}.$$

In this equation, $R_{ka}$ and $R_{bk}$ are matrix elements of the rotation operator which represents the coherence transfer from transition a to transition k and from transition k to transition b, respectively, induced by the rf pulses. The summation over k runs over all allowed and forbidden transitions including transitions differing merely in their sign.

With the mixing time $t_m$ incremented in proportion to $t_1$, as expressed by Eq. (2), we obtain $$M_{ab}(t_1,t_{m0} + t_1,t_2) = M_{0a} \sum_k R_{bk}R_{ka}\exp\{-i(\omega_a + \chi\omega_k)t_1 - \qquad (4)$$

$$t_1(1/T_{2a} + \chi/T_{2k})\}\exp\{-i\omega_k t_{m0} - t_{m0}/T_{2k}\}\exp\{-i\omega_b t_2 - t_2/T_{2b}\}.$$

Two-dimensional Fourier transformation for a fixed mixing time $t_m$ would lead to single cross-peaks at $\omega_1 = \omega_a$ and $\omega_2 = \omega_b$. However, if $t_m$ is incremented, a one-dimensional array of peaks is generated at $\omega_1 = \omega_a + \chi\omega_k$ and $\omega_2 = \omega_b$, with the line widths in the $\omega_1$ direction being $1/T_{2a} + 1/T_{2k}$. It is essential to recognize that all undesired transfer paths with oscillatory behavior ($\omega_k \neq 0$) lead to displaced cross-peaks, leaving in the position $\omega_1 = \omega_a$ and $\omega_2 = \omega_b$ exclusively cross-peaks with random exchange intensities. The degree of displacement of the J-cross-peaks can be controlled by proper selection of the parameter $\chi$.

Incoherent magnetization transfer is not significantly affected by the incremented mixing time as long as the incrementation parameter $\chi$ and the total variation of the mixing time $t_m$ are selected to be sufficiently small.

For further explanation of the invention, we are now going to regard some experimental data obtained with the aid of the method of the invention from two systems, the first of them consisting of small and the second of very big molecules.

Figure 3:
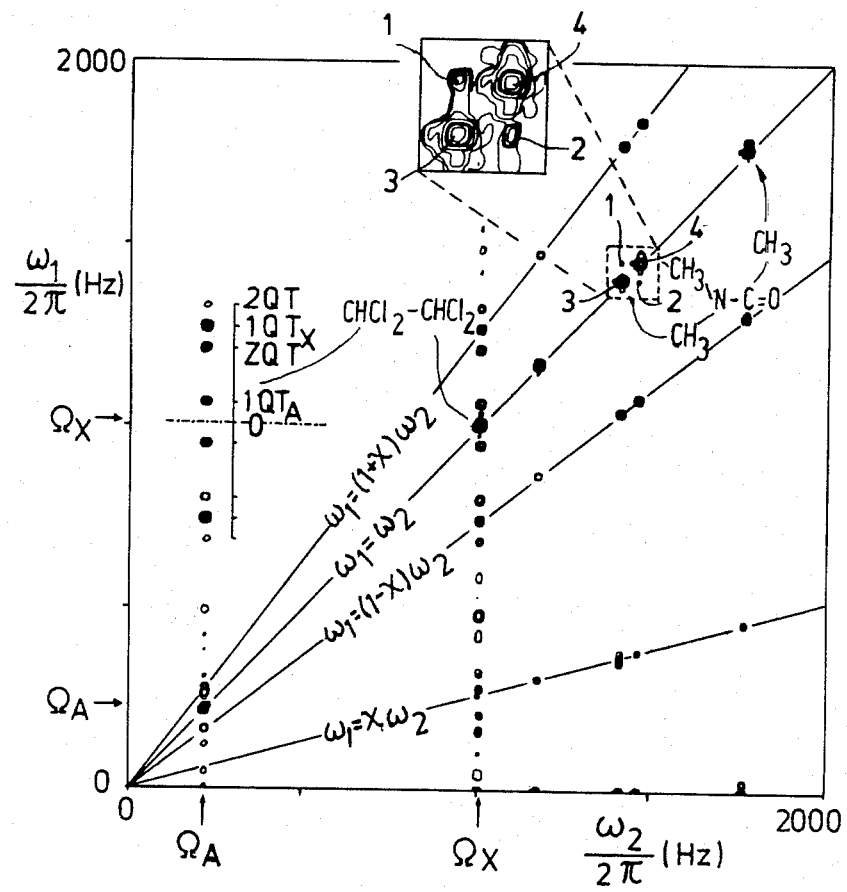
FIG. 3 shows a two-dimensional exchange spectrum of a 1:1 mixture of 1,1,2-trichloroethane and N,N-dimethylacetamide at 297 K, with variation of the exchange period $t_m$ from 100 to 132 ms, in accordance with the invention.

Exchange Spectra of a Mixture of 1,1,2 Trichloroethane and N,N Dimethylacetamide To demonstrate the importance of coherent and incoherent magnetization transfer, a mixture of 1,1,2 trichloroethane (TCE) and N,N dimethylacetamide (DMA) has been selected. The proton resonance spectrum of TCE consists of a J-coupled $AX_2$ spin system leading to coherent transfer. On the other hand, the chemical exchange due to hindered rotation in DMA causes incoherent magnetization exchange. FIG. 3 shows a two-dimensional spectrum recorded in accordance with the invention in the form of a contour plot of the absolute values of a mixture of TCE and DMA in equal proportions. The six peaks of the one-dimensional spectrum characteristic of the chemical shifts of TCE, the solvent and DMA, are displayed along the main diagonal $\omega_1 = \omega_2$. The multiplet structure of the TCE peaks is not visible because of limited digital resolution. The two cross-peaks 1 and 2 between the two N-methyl peaks 3 and 4 of DMA indicate the exchange between the methyl groups caused by internal rotation. The exchange cross-peaks are more clearly visible in the enlarged spectral region. The two J-cross-peaks at $(\omega_1 = \Omega_A, \omega_2 = \omega_X)$ and $(\omega_1 = \Omega_X, \omega_2 = \Omega_A)$ expected for the $AX_2$ spin system of TCE appear separated into their multiple quantum components spread along the lines $\omega_2 = \Omega_A$ and $\omega_2 = \Omega_X$. Four pairs of J-cross-peaks are visible along both lines, shifted symmetrically in positive and negative $\omega_1$ direction by the corresponding multiple quantum precessing frequencies scaled by the factor $\chi$. The four pairs of J-cross-peaks belong to two single-quantum transitions, $1QT_A$, and $1QT_X$, one zero-quantum transition, ZQT and to one double-quantum transition 2QT. The multiple quantum pattern of the lower left J-cross-peak in FIG. 3 is perturbed by signal folding at the frequency $\omega_1 = 0$. The two diagonal peaks of TCA which are connected by J-couplings appear also spreaded into their multiple quantum components analogous to the J-cross-peaks. Axial peaks appear along the $\omega_2$ axis ($\omega_1 = 0$), due to partial recovery of longitudinal magnetization during the mixing period. Peaks which lie along the straight line $\omega_1 = \chi\omega_2$ originate from longitudinal magnetization recovered during the evolution period. This magnetization is rotated into the transverse plane by the second 90° pulse and evolves during the mixing time only. Therefore its frequencies are scaled by the factor $\chi$. Two groups of peaks located along the straight lines $\omega_1 = (1+\chi)\omega_2$ and $\omega_1 = (1-\chi)\omega_2$, belong to magnetization which is transverse during both the evolution and the mixing periods. The two acquired precessing angles $\omega_1 t_1$ and $\omega_1\chi t_1$ can be additive or subtractive due to the effect of the second 90° pulse.

Figure 4:
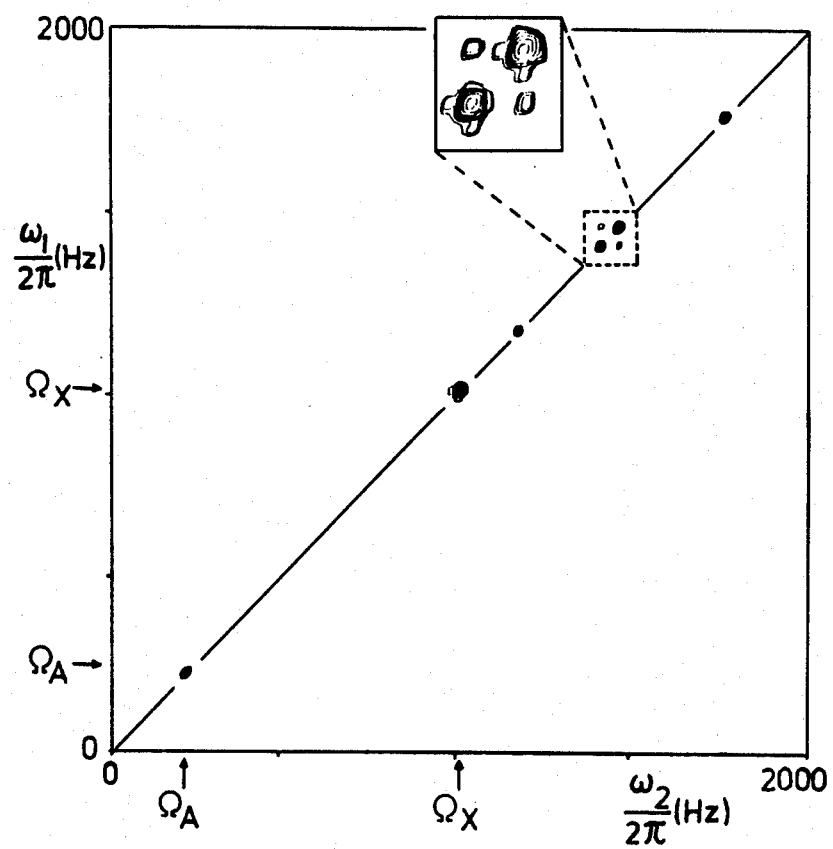
FIG. 4 shows the same spectrum as FIG. 3, but after symmetrization.
Figure 5:
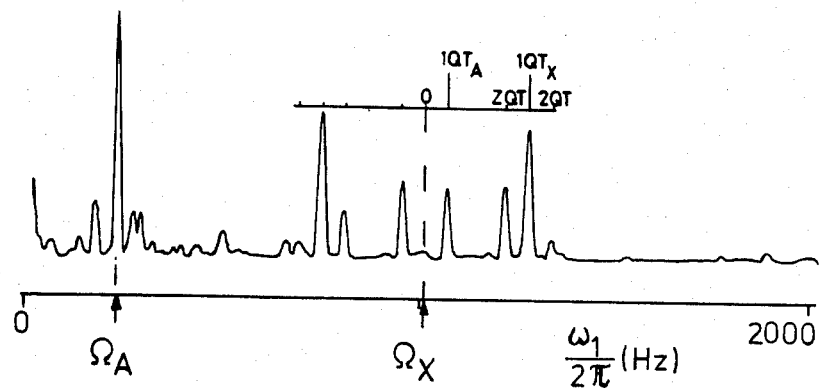
FIG. 5 shows a cross-section through the spectrum of FIG. 3.
Figure 6:
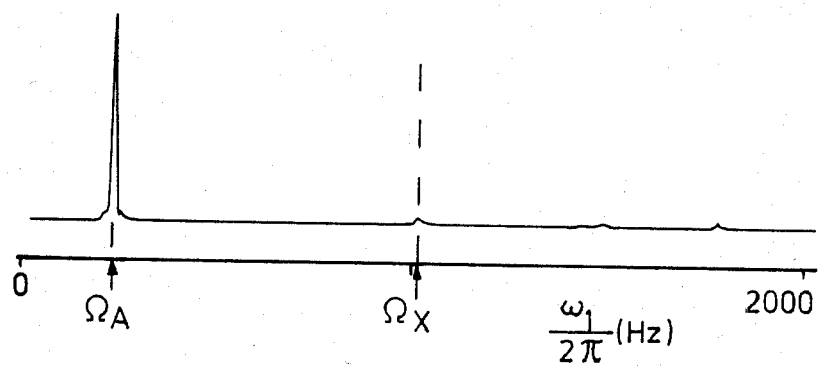
FIG. 6 shows a cross-section through the spectrum of FIG. 4.

FIG. 4 shows the spectrum of FIG. 3 after symmetrization. All peaks lacking symmetry with respect to the main diagonal were eliminated. Only diagonal peaks and exchange cross-peaks remain. This is also clearly demonstrated by FIGS. 5 and 6, where cross-sections parallel to $\omega_1$ for $\omega_2 = \Omega_A$ through the diagrams shown in FIGS. 3 and 4 are shown. It is essential to note that when the method of the invention is applied no peaks exist at the frequency $\Omega_X$ in the $\Omega_A$ cross-section (and correspondingly at the frequency $\Omega_A$ in the $\Omega_X$ cross-section). This fact is the basis for the complete suppression of J-cross-peaks by symmetrization. Two corresponding cross-sections parallel to $\omega_1$ at $\omega_2 = \Omega_A$ through the spectra of FIGS. 3 and 4 are shown in FIGS. 5 and 6. They demonstrate the effectiveness of the method for the suppression of J-cross-peaks in an impressive manner.

NOE Spectrum for a Basic Pancreatic Trypsin Inhibitor (BPTI)

Figure 7:
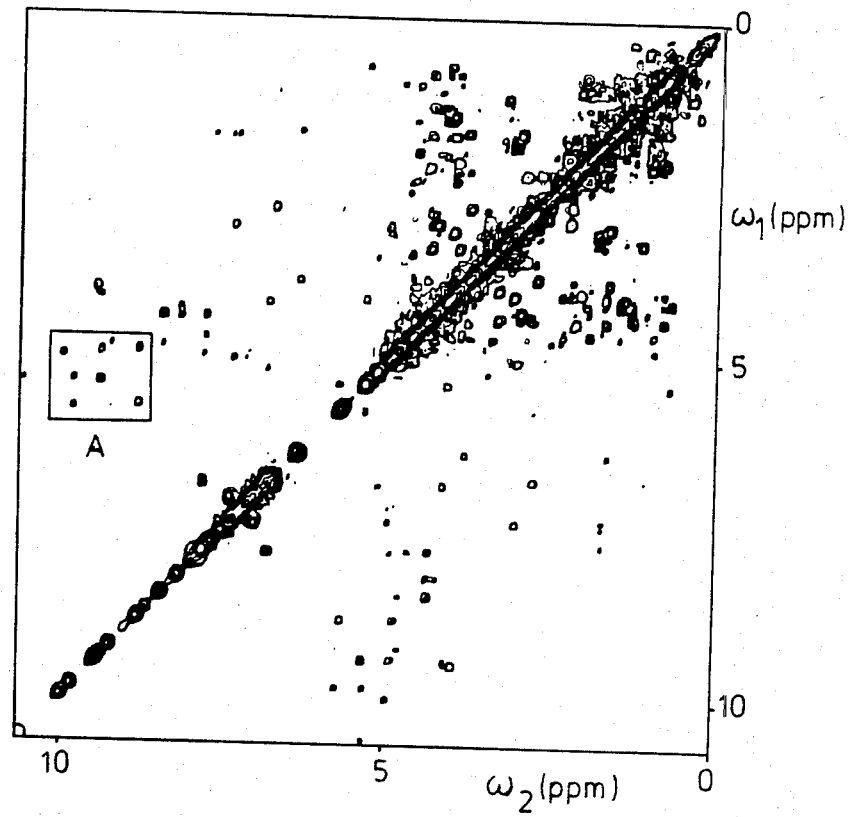
FIG. 7 shows a NOESY spectrum of the basic pancreatic trypsin inhibitor (BPTI), using a fixed mixing period $t_m = 30$ ms in accordance with prior art techniques.
Figure 8:
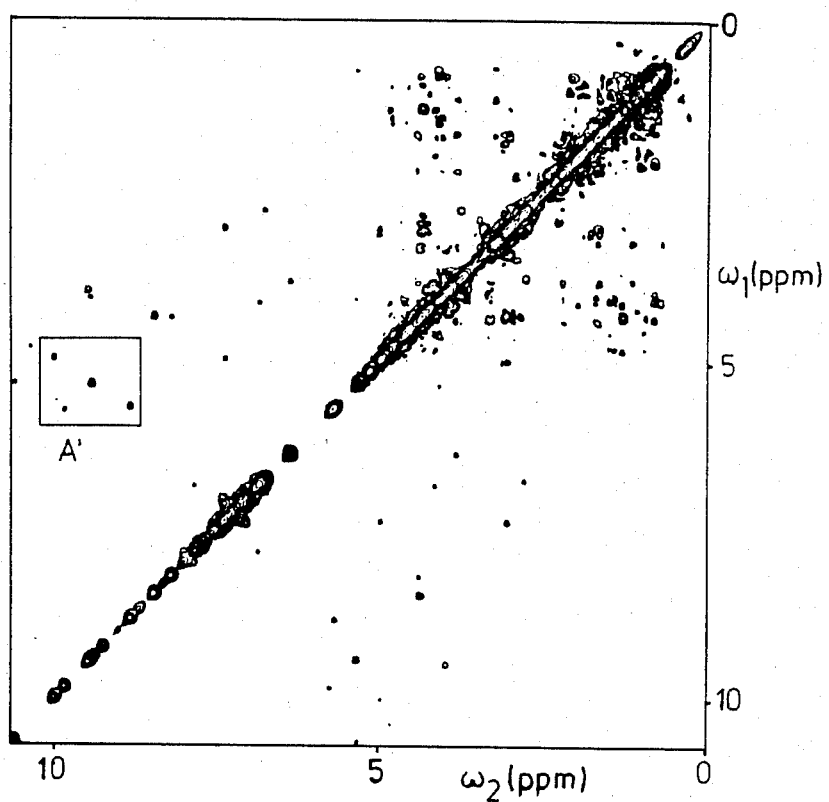
FIG. 8 shows a spectrum of the same BPTI, with variation of the mixing period between 30 ms and 37.8 ms, in accordance with the invention.
Figure 9:
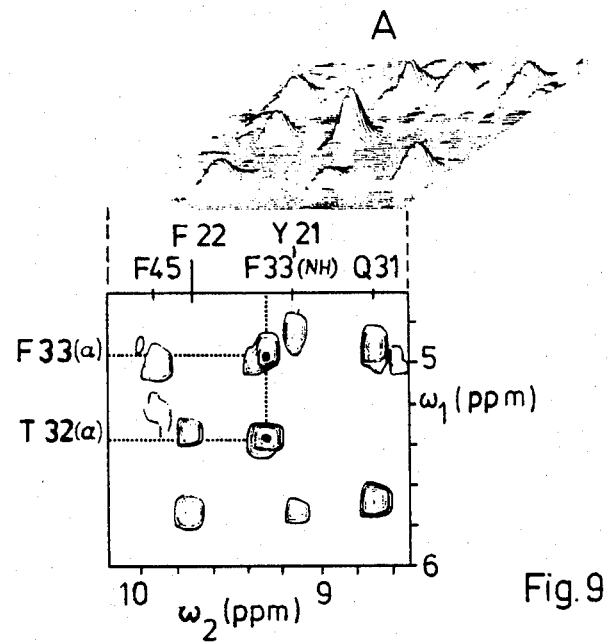
FIG. 9 shows two- and three-dimensional representations of section A of the spectrum of FIG. 7.

The application of the method of the invention for the investigation of biological macromolecules will be demonstrated hereafter with the aid of BPTI spectra where the J-coupling and cross-relaxation networks are rather well understood (cf., for instance, K. Wüthrich and G. Wagner in J.Mol. Bol. 130, 1 (1979)). FIGS. 7 and 8 show a NOE spectrum recorded on the one hand with fixed mixing time and on the other hand with the incremented mixing technique of the invention. The following discussion concentrates on the differences between the spectra of FIGS. 7 and 8 in the regions A and A', which are shown in more detail in FIGS. 9 and 10.

Figure 10:
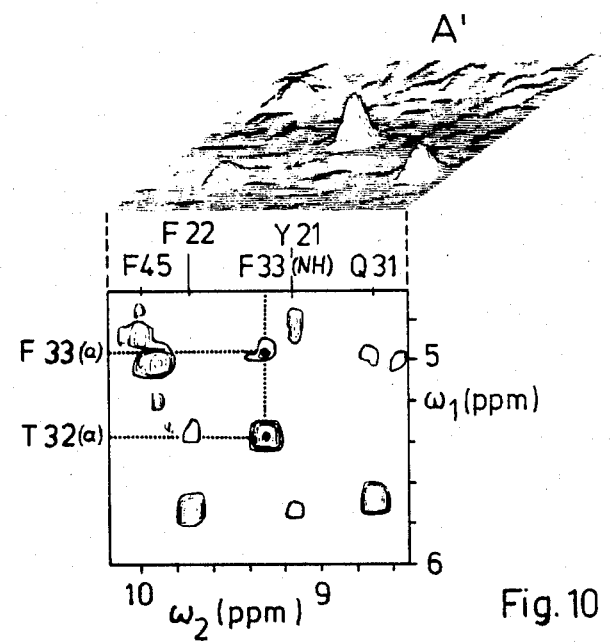
FIG. 10 shows two- and three-dimensional representations of the corresponding section A' of the spectrum of FIG. 8.

Five J cross-peaks appearing in the region A of the spectrum of FIG. 7 are eliminated by the method of the invention, as can be clearly seen in region A' of FIG. 8. However, more careful inspection of the same regions shows that after elimination of the J cross-peaks, coinciding NOE cross-peaks become visible. The possibility to separate coinciding J and NOE cross-peaks is very important for quantitiative interpretation of NOE data on proteins, since in spectra recorded with very short mixing times NOE cross-peaks belonging to protons of the same amino acid residue may be masked by coinciding J cross-peaks. For example, the cross-peak between C$\alpha$H and NH of residue F 33 (FIG. 9) is a typical J cross-peak which masks the coinciding NOE cross-peak. However, after elimination of the J cross-peak by the method of the invention, the NOE cross-peak becomes visible and quantitatively measurable (FIG. 10). On the other hand, pure NOE cross-peaks like the one between CαH of T 32 and NH of F 33 are not affected by the incrementation of $t_m$. A similar behavior was observed for the connectivities with all 5 amide proton resonances identified in FIGS. 9 and 10, i.e. the NH groups of F 45, F 22, F 33, Y 21 and Q 31. Each of these amide protons gives rise to two cross-peaks in the spectral region shown in FIGS. 9 and 10. In each case the pure NOE cross-peak with the α-proton of the preceding residue in the amino acid sequence has essentially identical intensity in the spectra of FIGS. 9 and 10. In contrast, as a consequence of the incrementation of the mixing time, the intensity of the cross-peak with the vicinal α-proton of the same residue is reduced in FIG. 10 whereby the residual intensity arises entirely from the incoherent NOE exchange.

For recording the spectra shown in the drawing, a nuclear magnetic resonance spectrometer make Bruker-Analytik GmbH, type CXP 300, has been employed. This spectrometer permits the generation of 90° pulse sequences with independently variable and programmable pulse intervals. For carrying out the method of the invention, a spectrometer of this type may be especially adapted so that instead of the time pairs $t_1$, $t_m$, only the variable times $t_1$ must be set while the initial mixing time $t_{m0}$ and the proportionality factor $\chi$ can be pre-set, or when measuring is carried out in a programmed manner, entered as a fixed value whereupon the spectrometer will itself form the second pulse interval $t_m = t_{m0} + \chi t_1$. It results that whenever the terms "set" or "setting" are used herein, entering of a corresponding command into the control means of a spectrometer of this type is also included.

Figure 11:
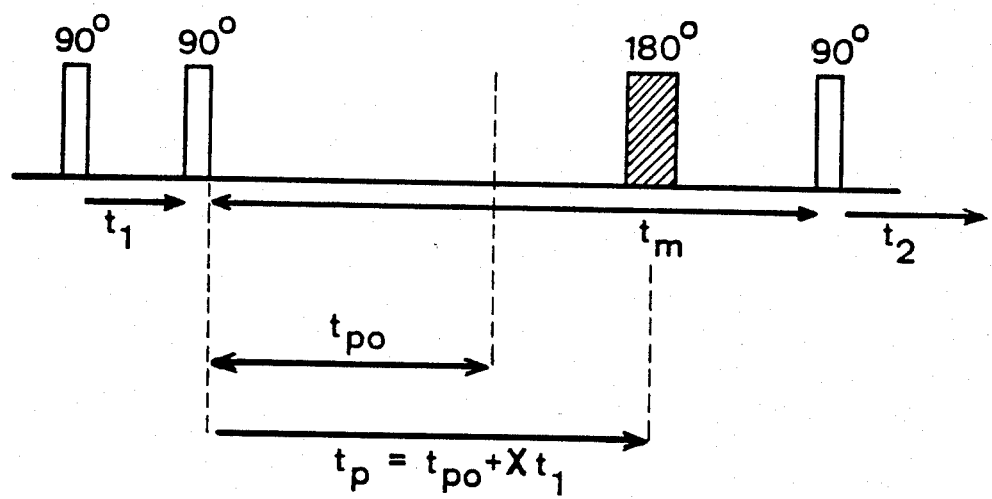
FIG. 11 shows the time diagram of the pulse sequence employed in the second variant of the method of the invention.

Instead of proceeding as described above, i.e. varying the interval between the second and the third 90° pulses (mixing time $t_m$) for each repetition of the experiment in proportion to the evolution period $t_1$, one may, with the same effect, generate within the mixing period an additional 180° pulse with incrementation of its position $t_p$ in proportion to the evolution period $t_1$ ($t_p = t_{p0} + \chi t_1$), as shown in FIG. 11. In this case, the entire mixing time $t_m$ must be kept constant. The position of the 180° pulse affects exclusively the precession of the magnetization leading to the J cross-peaks while the incoherent magnetization exchange which is to be measured by the experiment is not at all affected.

The time-shifted 180° pulse has the same displacement effect on the J cross-peaks as the incrementation of the mixing time $t_m$ so that the J cross-peaks can again be eliminated by triangular multiplication or symmetrization. However, the 180° pulse does not at all affect the incoherent exchange so that this modified method of the invention should be preferred in critical situations where great demands are placed on precision.

We claim:

1. A method for recording two-dimensional nuclear magnetic resonance spectra of a nuclear spin system having spins between which a coupling exists, said coupling causing a shift of the resonance frequency of said spins, in which method said nuclear spin system is excited by three successive 90° pulses and an interferogram obtained after application of the third 90° pulse is subjected to Fourier analysis, in which further a plurality of such measurements is taken with different intervals between the first and the second 90° pulses known as the evolution period $t_1$ and the resulting different amplitudes of the resonance lines obtained by the said Fourier analysis are stored as instantaneous values of an additional interferogram and subjected to a second Fourier analysis, and in which simultaneously with each repetition of the measurement with a varied evolution period $t_1$ the time interval between the second and the third 90° pulses, which is known as the mixing time $t_m$, is systematically varied by increments covering the domain defined by the period of the frequency shifts caused by said couplings, characterized in that starting from an initial value $t_{m0}$, the mixing time $t_m$ is varied proportionally to the evolution period $t_1$ whereby $t_m = t_{m0} + \chi t_1$ so that with an envisaged number of n measurements the time variation of the mixing time $t_{mn} - t_{m0}$, which is relatively small compared to $t_{m0}$, is substantially equal to the period of frequency displacements caused by said coupling, and in that the two-dimensional spectrum thus obtained is subjected to the techniques of triangular multiplication or symmetrization whereby all peaks which do not possess counterparts at the mirror symmetry position with respect to a main diagonal are eliminated.

2. A method for recording two-dimensional nuclear magnetic resonance spectra of a nuclear spin system having spins between which a coupling exists, said coupling causing a shift of the resonance frequency of said spins, in which method said nuclear spin system is excited by three successive 90° pulses and an interferogram obtained after application of the third 90° pulse is subjected to Fourier analysis, in which further a plurality of such measurements is taken with different intervals between the first and the second 90° pulses known as the evolution period $t_1$ and the resulting different amplitudes of the resonance lines obtained by the said Fourier analysis are stored as instantaneous values of an additional interferogram and subjected to a second Fourier analysis, and in which finally a 180° pulse is inserted between the second and the third 90° pulses and the interval $t_p$ between the 180° pulse and the second 90° pulse is systematicaly varied, with each repetition of the measurement with another evolution period $t_1$, by increments covering the domain defined by the period of the frequency shift caused by said couplings, characterized in that the time interval $t_p$ is systematically varied, starting from an initial value $t_{p0}$ and in proportion to the evolution period $t_1$ whereby $t_p = t_{p0} + \chi t_1$, so that with an envisaged number of n measurements the time variation of the positioning time $t_{pn} - t_{p0}$, which is relatively small compared to $t_m$, is in the range of the period of frequency displacements caused by said coupling, and in that the two-dimensional spectrum thus obtained is subjected to the techniques of triangular multiplication or symmetrization whereby all peaks which do not possess counterparts at the mirror symmetry position with respect to a main diagonal are eliminated.

3. A nuclear magnetic resonance spectrometer for carrying out the method of claims 1 or 2, having a generator for generating successive rf pulses at selected intervals, characterized in that the generator includes means for presetting an interval between the second and the third pulse which varies in direct proportional to the interval $t_1$ between the first and the second pulse, by corresponding selection of the first interval $t_1$, an initial value for the interval between the second and the third pulse and a proportionality factor $\chi$.

* * * * *